United States Patent
Stormont et al.

(10) Patent No.: US 10,185,002 B2
(45) Date of Patent: Jan. 22, 2019

(54) SYSTEMS AND METHODS FOR MRI COMMON MODE TRAPS

(71) Applicant: General Electric Company, Schenectady, NY (US)

(72) Inventors: Robert Steven Stormont, Hartland, WI (US); Scott Allen Lindsay, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 618 days.

(21) Appl. No.: 14/730,741

(22) Filed: Jun. 4, 2015

(65) Prior Publication Data

US 2016/0356868 A1  Dec. 8, 2016

(51) Int. Cl.
*G01R 33/36* (2006.01)
*G01R 33/34* (2006.01)

(52) U.S. Cl.
CPC ......... *G01R 33/3685* (2013.01); *G01R 33/34* (2013.01)

(58) Field of Classification Search
CPC ........................... G01R 33/3685; G01R 33/34
USPC ....................................................... 324/322
See application file for complete search history.

(56) References Cited

U.S. PATENT DOCUMENTS

| | | | |
|---|---|---|---|
| 5,059,906 A | 10/1991 | Yamanaka | |
| 5,484,985 A | 1/1996 | Edelstein et al. | |
| 6,215,307 B1 | 4/2001 | Sementchenko | |
| 6,284,971 B1 | 9/2001 | Atalar et al. | |
| 6,294,965 B1 | 9/2001 | Merrill et al. | |
| 6,320,385 B1 | 11/2001 | Burl et al. | |
| 6,392,502 B2 | 5/2002 | Sweeney et al. | |
| 6,608,480 B1 | 8/2003 | Weyers | |
| 6,628,980 B2 | 9/2003 | Atalar et al. | |
| 6,750,652 B2 | 6/2004 | Weyers et al. | |
| 6,898,454 B2 | 5/2005 | Atalar et al. | |
| 7,126,337 B2 | 10/2006 | Oppelt | |
| 7,215,121 B2 | 5/2007 | Sambandamurthy et al. | |
| 7,378,851 B1 | 5/2008 | de Roij et al. | |
| 8,649,842 B2 | 2/2014 | Atalar et al. | |
| 2002/0003454 A1 | 1/2002 | Sweeney et al. | |
| 2003/0094950 A1* | 5/2003 | Burl ................... | G01R 33/3621 324/322 |
| 2006/0055408 A1 | 3/2006 | Sambandamurthy et al. | |

(Continued)

FOREIGN PATENT DOCUMENTS

| | | |
|---|---|---|
| WO | 2007034341 A2 | 3/2007 |
| WO | 2014003918 A1 | 1/2014 |

OTHER PUBLICATIONS

International Search Report and Written Opinion for International Application No. PCT/US2016/035708, dated Sep. 12, 2016, 11 pages.

*Primary Examiner* — Melissa Koval
*Assistant Examiner* — Courtney McDonnough

(57) ABSTRACT

A continuous common mode trap assembly includes a central conductor and plural common mode traps. The central conductor has a length, and is configured to transmit a signal between a magnetic resonance imaging (MRI) receive coil and at least one processor of an MRI system. The plural common mode traps extend along at least a portion of the length of the central conductor. The common mode traps are disposed contiguously. The common mode traps are configured to provide an impedance to reduce transmitter driven currents of the MRI system.

14 Claims, 6 Drawing Sheets

(56) References Cited

U.S. PATENT DOCUMENTS

2008/0033497 A1* 2/2008 Bulkes ................... A61N 1/05
  607/9
2010/0218970 A1* 9/2010 Eshima ................ H01B 7/228
  174/108
2012/0271394 A1 10/2012 Foster et al.

* cited by examiner

SYSTEMS AND METHODS FOR MRI COMMON MODE TRAPS

BACKGROUND OF THE INVENTION

Embodiments of the present disclosure generally relate to common mode traps, for example common mode rejection cables for magnetic resonance imaging (MRI) systems.

MRI is a medical imaging modality that generates images of the inside of a human body without using x-rays or other ionizing radiation. MRI or Nuclear Magnetic Resonance (NMR) imaging generally provides for the spatial discrimination of resonant interactions between Radio Frequency (RF) waves and nuclei in a magnetic field. Typically, an MRI system includes a superconducting magnet that generates a main magnetic field within an imaging volume. The MRI system uses various types of radio frequency (RF) coils to create pulses of RF energy. The RF coils transmit RF excitation signals and receive magnetic resonance (MR) signals that the MRI system processes to form the images.

Coil interfacing cables may be used to transmit signals between the RF coils and other aspects of the processing system, for example to control the RF coils and/or to receive information from the RF coils. The coil interfacing cables may be disposed within the bore of the MRI system and subjected to electro-magnetic fields produced and used by the MRI system. The cables may support transmitter driven common mode currents which create field distortions and/or unpredictable heating of components. Conventionally, baluns or common mode traps that provide high common mode impedances may be utilized to mitigate the effect of transmitter driven currents. However, placing the common mode traps or blocking circuits at appropriate locations may be difficult, as the appropriate placement may vary based on the positioning of a cable or coil associated with the common mode traps. Also, excessive voltage and/or power dissipation may occur even if conventional common mode traps or blocking circuits are placed at appropriate locations. Further, adding additional conventional discretely located baluns or common mode traps may be unwieldy and/or cost prohibitive.

BRIEF DESCRIPTION OF THE INVENTION

In one embodiment, a continuous common mode trap assembly is provided that includes a central conductor and plural common mode traps. The central conductor has a length, and is configured to transmit a signal (or signals) between a magnetic resonance imaging (MRI) receive coil and at least one processor of an MRI system. The plural common mode traps extend along at least a portion of the length of the central conductor. The common mode traps are disposed contiguously. The common mode traps are configured to provide an impedance to reduce transmitter driven currents of the MRI system.

In another embodiment, a continuous common mode trap assembly is provided that includes a central conductor, a dielectric spacer, a first common mode trap conductor, and a second common mode trap conductor. The central conductor has a length and is configured to transmit a signal (or signals) between a magnetic resonance imaging (MRI) receive coil and at least one processor of an MRI system. The dielectric spacer is disposed radially about the central conductor and extends along at least a portion of the length of the central conductor. The first common mode trap conductor is wrapped in a spiral about the dielectric spacer in a first direction, and the second common mode trap conductor is counter-wrapped about the dielectric spacer in a second direction opposite to the first direction.

In another embodiment, a method for providing a transmission cable for a receive coil of a magnetic resonance imaging (MRI) system is provided. The method includes providing a central conductor having a length. The central conductor is configured to transmit a signal (or signals) between the receive coil and at least one processor of the MM system. Further, the method includes disposing a dielectric spacer radially about the central conductor along at least a portion of the length of the central conductor. Also, the method includes wrapping a first common mode trap conductor spirally about the dielectric spacer in a first direction, and wrapping a second common mode trap conductor about the dielectric spacer in a second direction opposite to the first direction.

DETAILED DESCRIPTION OF THE INVENTION

Figure 1:
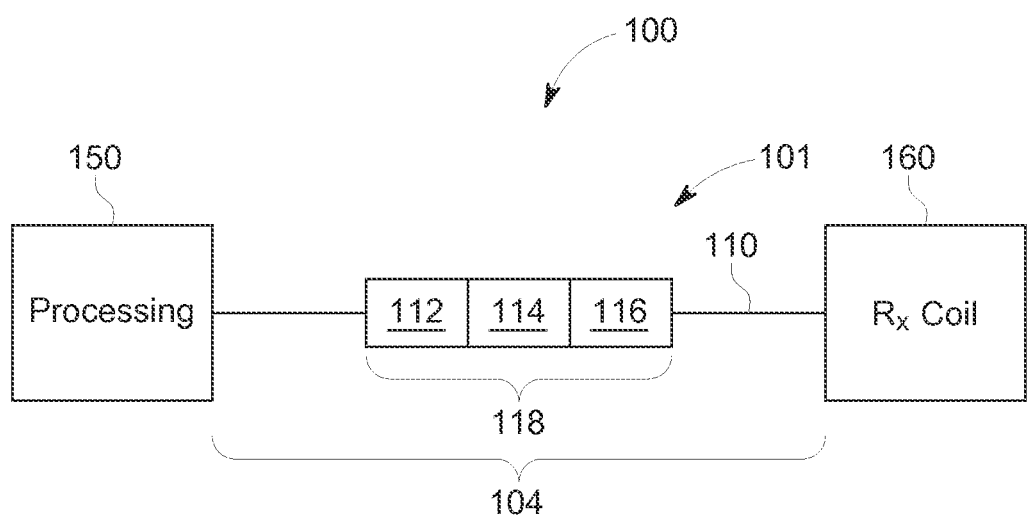
FIG. 1 illustrates a block schematic diagram of a continuous common mode trap assembly formed in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and preceded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide continuous and/or contiguous common mode blocking cables for interfacing with MRI coils. Various embodiments have light weight and/or flexibility providing for easy, convenient, efficient, reliable, and/or cost effective interfacing with MRI coils. Various embodiments provide transmission cables with reduced or eliminated interaction with fields. Transmission cables provided by various embodiments may thus be understood as transparent to fields or as metamaterials with respect to the fields.

In various embodiments, butterfly or flux-cancelling structures are employed in a repeated pattern (e.g., in-line with each other) to eliminate or reduce transmitter driven currents (e.g., transmitter driven common mode currents in a transmission cable exposed to transmitted magnetic fields of an MRI system). For example, a transmitter driven common mode current may be generated by or result from a magnetic field of an MRI system (e.g., a magnetic field provided by a transmit coil of the MRI system). In some embodiments, rigid butterfly structures may be joined by flexible sections. In some embodiments, flexible butterfly structures may be integrally formed or otherwise contiguously joined with each other to provide a continuously flexible common mode trap assembly and/or transmission cable.

Various embodiments provide improved control of currents induced by magnetic fields used with MRI systems. A technical effect of at least one embodiment includes improving improved performance of MRI systems, for example due to reduced interaction between transmission cables and coil elements. A technical effect of at least one embodiment includes improved heat distribution, for example distributing heat generated by common mode traps over a larger area and/or reducing, minimizing, or preventing hot spots. A technical effect of at least one embodiment includes helping to ensure that common mode blocking or trapping is provided at all appropriate locations along a transmission cable. A technical effect of at least one embodiment includes improved interfacing with lightweight, formable surface coils, for example by improving flexibility of common mode trap assemblies. A technical effect of at least one embodiment includes reduced cost. A technical effect of at least one embodiment includes improved distribution of voltage, for example by distributing voltage over sections of a continuous structure.

FIG. 1 illustrates a block schematic diagram of a continuous common mode trap assembly 100 formed in accordance with various embodiments. The continuous common mode trap assembly 100 may be configured, for example, for use in the bore of an MRI system. For example, in the illustrated embodiment, the common mode trap assembly 100 is configured as a transmission cable 101 configured for transmission of signals between a processing unit (or controller) 150 and a receive coil 160 of an MRI system (for general description of an example MRI system, see FIG. 8 and related discussion). In the illustrated embodiment, the transmission cable 101 (or common mode trap assembly 100) includes a central conductor 110 and plural common mode traps 112, 114, 116. It may be noted that, while the common mode traps 112, 114, and 116 are depicted as distinct from the central conductor 110, in some embodiments, the common mode traps 112, 114, 116 may be integrally formed with or as a part of the central conductor 110.

The central conductor 110 in the illustrated embodiment has a length 104, and is configured to transmit a signal between the MRI receive coil 160 and at least one processor of an MRI system (e.g., processing unit 150). The central conductor 110 may include one or more of a ribbon conductor, a wire, or a coaxial cable bundle, for example. The length 104 of the depicted central conductor extends from a first end 102 of the central conductor 110 (which is coupled to the processing unit 150) to a second end 103 of the central conductor 110 (which is coupled to the MRI receive coil 160). In some embodiments, the central conductor may pass through a central opening of the common mode traps 112, 114, 116.

The depicted common mode traps 112, 114, 116 (which may be understood as cooperating to form a common mode trap unit 118), as seen in FIG. 1, extend along at least a portion of the length 104 of the central conductor 110. In the illustrated embodiment, common mode traps 112, 114, 116 do not extend along the entire length 104; however, in other embodiments, the common mode traps 112, 114, 116 or common mode trap unit 118 may extend along the entire length 104, or substantially along the entire length 104 (e.g., along the entire length 104 except for portions at the end configured to couple, for example, to a processor or a receive coil). The common mode traps 112, 114, 116 are disposed contiguously. As seen in FIG. 1, each of the common mode traps 112, 114, 116 is disposed contiguously to at least one other of the common mode traps 112, 114, 116. As used herein, contiguous may be understood as including components or aspects that are immediately next to or in contact with each other. For example, contiguous components may be abutting one another. It may be noted that in practice, small or insubstantial gaps may be between contiguous components in some embodiments. In some embodiments, an insubstantial gap (or conductor length) may be understood as being less than 1/40 of a wavelength of a transmit frequency in free space. In some embodiment, an insubstantial gap (or conductor length) may be understood as being 2 centimeters or less. Contiguous common mode traps, for example, have no (or insubstantial) intervening gaps or conductors therebetween that may be susceptible to induction of current from a magnetic field without mitigation provided by a common mode trap. For example, as depicted in FIG. 1, the common mode trap 112 is contiguous to the common mode trap 114, the common trap 114 is contiguous to the common mode trap 112 and the common mode trap 116 (and is interposed between the common mode trap 112 and the common mode trap 116), and the common mode trap 116 is contiguous to the common mode trap 116. Each of the common mode traps 112, 114, 116 are configured to provide an impedance to the reduce transmitter driven currents of an MRI system. The common mode traps 112, 114, 116 in various embodiments provide high common mode impedances. Each common mode trap 112, 114, 116, for example, may include a resonant circuit and/or one or more resonant components to provide a desired impedance at or near a desired frequency or within a target frequency range. It may be noted that the common mode traps 112, 114, 116 and/or common mode trap unit 118 may also be referred to as chokes or baluns by those in the art.

In contrast to systems having separated discrete common mode traps with spaces therebetween, various embodiments (e.g., the common mode trap assembly 100) have a portion over which common mode traps extend continuously and/or contiguously, so that there are no locations along the portion for which a common mode trap is not provided. Accordingly, difficulties in selecting or achieving particular placement locations of common mode traps may be reduced or eliminated, as all locations of interest may be included within the continuous and/or contiguous common mode trap. In various embodiments, a continuous trap portion (e.g., common trap unit 118) may extend along a length or portion thereof of a transmission cable. The continuous trap portion may be formed of contiguously joined individual common mode traps or trap sections (e.g., common mode traps 112, 114, 116). Further, contiguous common mode traps may be employed in various embodiments to at least one of lower the interaction with coil elements, distribute heat over a larger area (e.g., to prevent hot spots), or help ensure that blocking is located at desired or required positions. Further, contiguous common mode traps may be employed in various embodiments to help distribute voltage over a larger area. Additionally, continuous and/or contiguous common mode traps in various embodiments provide flexibility. For example, in some embodiments, common mode traps may be formed using a continuous length of conductor(s) (e.g., outer conductors wrapped about a central conductor) or otherwise organized as integrally formed contiguous sections. In various embodiments, the use of contiguous or continuous common mode traps (e.g., formed in a cylinder) provide for a range of flexibility over which flexing of the assembly does not substantially change the resonant frequency of the structure, or over which the assembly remains on frequency as it is flexed.

It may be noted that the individual common mode traps or sections (e.g., common mode traps 112, 114, 116) in various embodiments may be constructed or formed generally similarly to each other (e.g., each trap may be a section of a length of continuously wound coils), but each individual trap or section may be configured slightly differently than other traps or sections. For example, in some embodiments, each common mode trap 112, 114, 116 is tuned independently. Accordingly, each common mode trap 112, 114, 116 may have a resonant frequency that differs from other common mode traps of the same common mode trap assembly 100. Alternatively or additionally, each common mode trap may be tuned to have a resonant frequency near an operating frequency of the MRI system. As used herein, a common mode trap may be understood as having a resonant frequency near an operating frequency when the resonant frequency defines or corresponds to a band that includes the operating frequency, or when the resonant frequency is close enough to operating frequency to provide on-frequency blocking, or to provide a blocking impedance at the operating frequency. Further alternatively or additionally, each common mode trap may be tuned to have a resonant frequency below an operating frequency of the MRI system (or each common mode trap may be tuned to have resonant frequency above an operating frequency of the MRI system). With each trap having a frequency below (or alternatively, with each trap having a frequency above) the operating frequency, the risk of any of the traps canceling each other out (e.g., due to one trap having a frequency above the operating frequency and a different trap having a frequency below the operating frequency) may be eliminated or reduced. As another example, each common mode trap may be tuned to a particular band to provide a broadband common mode trap assembly.

Figure 2:
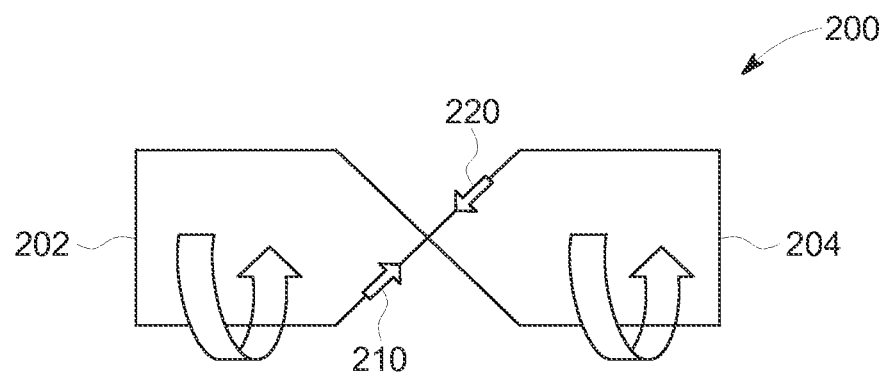
FIG. 2 illustrates an example 2-D butterfly configuration formed in accordance with various embodiments.

In various embodiments, the common mode traps may have a two or three dimensional butterfly configuration to counteract B field coupling and/or local distortions. FIG. 2 illustrates an example 2-D butterfly configuration 200 for which induced currents may cancel each other out. As seen in FIG. 2, the butterfly configuration 200 includes a first loop 202 and a second loop 204, which are co-planar with each other. The shape of the butterfly configuration 200 is configured so that an induced current 210 (a current induced due to a B field) in the first loop 202 and an induced current 220 in the second loop 204 cancel each other out. For example, if the field is uniform and the first loop 202 and the second loop 204 have equal areas, the resulting net current will be zero. It may be noted that the example of FIG. 2 is shown in 2-dimensions, and that other arrangements may be utilized to provide reduction or elimination of current induced due to a B-field, for example, in 3-dimensions. Further, 3-dimensional arrangements (e.g., cylindrical) may provide improved flexibility and consistency of resonant frequency during flexing relative to 2-dimensional arrangements.

Generally, a butterfly configuration as used herein may be used to refer to a conductor configuration that is flux cancelling, for example including at least two similarly sized opposed loops that are symmetrically disposed about at least one axis and are arranged such that currents induced in each loop (or group of loops) by a magnetic field tends to cancel out currents induced in at least one other loop (or group of loops). For example, with continued reference to FIG. 1, in some embodiments, counterwound conductors (e.g., conductors wound about a central member and/or axis in opposing spiral directions) may be spaced a distance radially from the central conductor 110 to form the common mode traps 112, 114, 116. In some embodiments, each individual common mode trap (e.g., 112, 114, 116) may correspond to a number of wraps of the counterwound conductors about the central conductor 110. In some embodiments, each common mode trap may correspond to a single wrap about the central conductor. An example of counterwound conductors is provided in FIG. 3.

Figure 3:
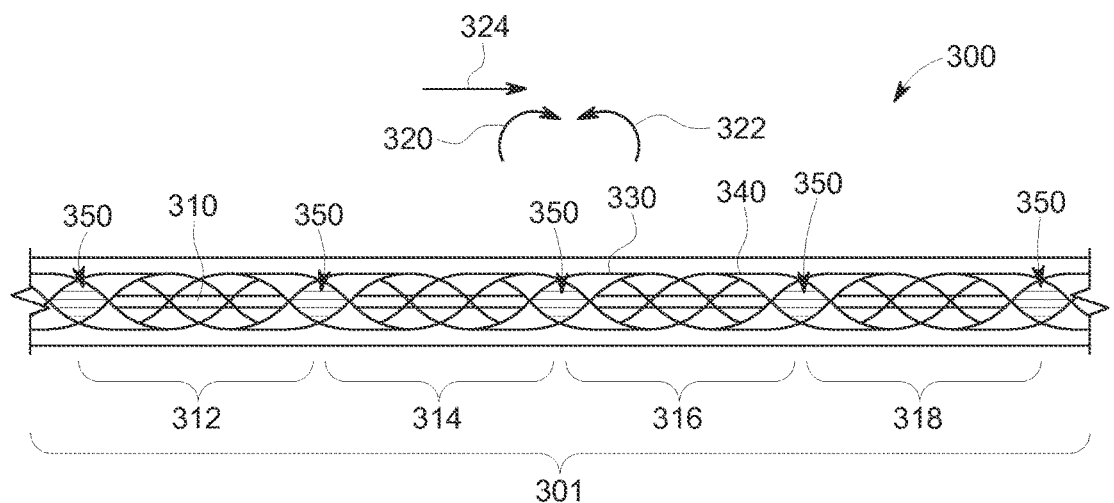
FIG. 3 illustrates a side view of a portion of a length 301 of a common mode trap assembly 300 formed in accordance with various embodiments.

FIG. 3 illustrates a side view of a portion of a length 301 of a common mode trap assembly 300 formed in accordance with various embodiments. The common mode trap assembly 300 includes a central conductor 310, a dielectric spacer (not shown in FIG. 3; see FIGS. 6 and 7 and related discussion for additional examples of dielectric spacers), a first common mode trap conductor 330, and a second common mode trap conductor 340. In some embodiments, an air gap may be used to separate the common mode trap conductors 330, 340 from the central conductor 310. The first common mode trap conductor 330 is wrapped in a spiral about the dielectric spacer, or wrapped in a spiral at a distance from the central conductor 310, in a first direction 320. Also, the second common mode trap conductor 340 is wrapped in a spiral about the dielectric spacer, or wrapped in a spiral at a distance from the central conductor 310, in a second direction 322 that is opposite to the first direction 324. In the illustrated embodiment, the first direction 320 is clockwise (as the spiral advances to the right along longitudinal direction 324) and the second direction 322 is counter-clockwise (as the spiral advances to the right along longitudinal direction 324). The various conductors of the common mode trap assembly 300 may be made of electrically conductive material (e.g., metal) and shaped as ribbons, wires, and/or cables, for example. In some embodiments, the counterwound or outer conductors may serve as a return path for a current passing through the central conductor 310. Further, in various embodiments, the counterwound conductors may cross each other orthogonally (e.g., a center line or path defined by the first common mode trap conductor 330 is perpendicular to a center line or path defined by the second common mode trap conductor 340 as the common mode conductors cross paths) to eliminate, minimize, or reduce coupling between the common mode conductors. It may be further noted that in various embodiments the first common mode trap conductor 330 and second common mode trap conductor 340 are loosely wrapped about a dielectric spacer to provide flexibility and/or to reduce any binding, coupling, or variation in inductance when the common mode trap assembly 300 is bent or flexed. It may be noted that the looseness or tightness of the counterwound outer conductors may vary by application (e.g., based on the relative sizes of the conductors and dielectric spacer, the amount of bending or flexing that is desired for the common mode trap assembly, or the like). Generally, the outer or counterwound conductors should be tight enough so that they remain in the same general orientation about the dielectric spacer, but loose enough to allow a sufficient amount of slack or movement during bending or flexing of the common mode trap assembly to avoid, minimize, or reduce coupling or binding of the counterwound outer conductors.

In the illustrated embodiment, the depicted portion of the common mode trap assembly 300 is separated into four individual common mode trap sections 312, 314, 316, 318. At the juncture of each common mode trap section with a contiguously located neighbor in the illustrated embodiment, capacitors 350 are provided. The capacitors 350 may be tuned or configured to provide a desired resonance. It may be noted that in some embodiments the capacitance of the common mode trap sections may be distributed (e.g., uniformly) along the length of the section.

Accordingly, it may be noted that common mode traps or baluns are disposed continuously along the depicted length of the common mode trap assembly 300. Such continuous common mode traps help eliminate or reduce overly high induced currents and/or standing waves, independent of positioning, in contrast to discretely located traps spaced at distances apart from each other. Additionally, thermal load in the illustrated embodiment may be shared through a common conductor.

It may further be noted that inductance of the central path and the return path of the illustrated embodiment are not substantially enhanced by mutual inductance, and are generally stable with geometry changes (e.g., bending or flexing of the common mode trap assembly 300). In various embodiments, capacitance is distributed along the length (either uniformly or at discrete locations distributed along the length) of the common mode trap assembly 300 and not substantially varied with geometry changes. In various embodiments, thermal load and/or voltage may also be distributed along the length. Generally, dimensions of the resonating circuits of various embodiments may ideally be very small; however, in practice dimensions will be limited by EB field intensities, local distortions, thermal/voltage stresses, or the like. Again, as discussed herein, each resonant section (e.g., 312, 314, 316, 318) may be tuned independently, for example below an operating frequency of an MRI system having a bore in which the common mode trap assembly 300 is disposed.

Figure 4:
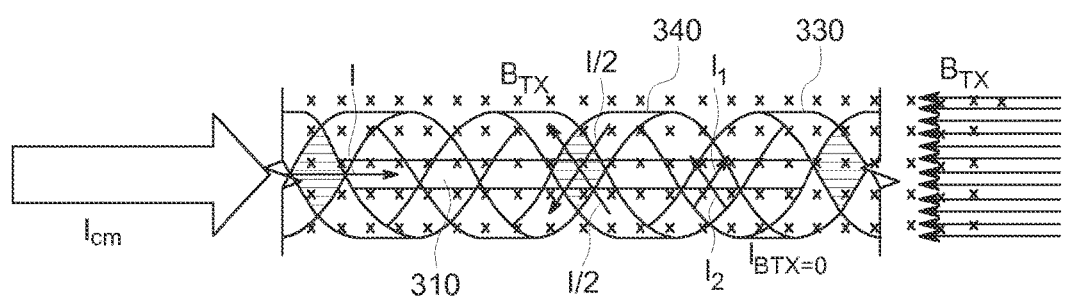
FIG. 4 illustrates various currents in the common mode trap assembly of FIG. 3.

FIG. 3 provides an example of a common mode trap assembly providing continuous baluns or common mode traps, with a grouped or repeated butterfly structure (e.g., the spirally counterwound outer conductors or common mode trap conductors.) FIG. 4 illustrates various currents in the common mode trap assembly of FIG. 3. In FIG. 4, a common mode current $I_{cm}$ is shown entering the central conductor 310 at the left of FIG. 4, and a current $I_{BTX}$ (induced by a magnetic field $B_{TX}$ (e.g., a magnetic field provided inside the bore of an MRI system, schematically depicted with arrows and x's in FIG. 4) is also depicted in FIG. 4. As seen in FIG. 4, the common mode current $I_{cm}$ is oriented toward the right hand side of FIG. 4, while return currents (noted as ½, with ½ equal to half of $I_{cm}$) are evenly divided between the first common mode trap conductor 330 and the second common mode trap conductor 340. The net $I_{cm}$ is therefore zero, as $I_{cm}-I_{cm}/2-I_{cm}/2=0$. Due to the counterwound spiral or repeated butterfly pattern of the first common mode trap conductor 330 and the second common mode trap conductor 340, the current $I_1$ induced in the first common mode trap conductor 330 by the magnetic field $B_{TX}$ cancels out the current $I_2$ induced in the second common mode trap conductor 340 by the magnetic field $B_{TX}$. Put another way, $I_1$ and $I_2$ have similar magnitudes but are oriented in opposite directions along the length of the common mode trap assembly, such that $I_{BTX}=I_1-I_2=0$. It may be noted that the spiral shape along the length of the assembly may address fields that are oriented laterally, while the counterwinding may address fields that are axially oriented.

Figure 5:
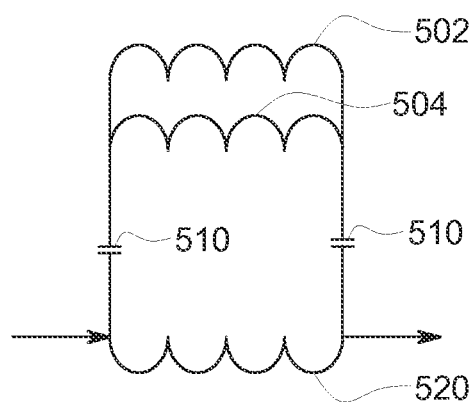
FIG. 5 illustrates an electrical schematic view of the common mode trap assembly of FIGS. 3 and 4.

FIG. 5 is an electrical schematic diagram representative of a common mode trap 500 of the common mode trap assembly of FIGS. 3 and 4. As seen in FIG. 5, a first inductor 502 (representative of the first common mode trap conductor 330) and a second inductor 504 (representative of the second common mode trap conductor 340) are aligned in parallel, with capacitors 510 interposed between a third inductor 520 (representative of the central conductor 310) and the first and second inductors 502, 504.

Figure 6:
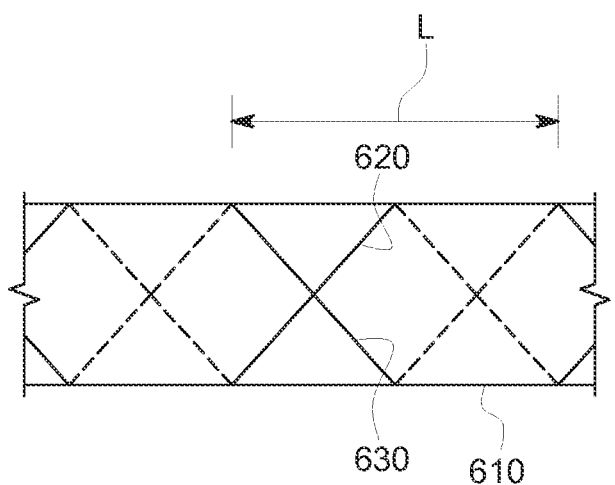
FIG. 6 illustrates a schematic side view of a common mode trap assembly formed in accordance with various embodiments.

As discussed herein, outer conductors spirally wound about a dielectric spacer may be arranged to cross each other orthogonally, to reduce or eliminate coupling between the outer conductors. FIG. 6 depicts an example common mode trap assembly 600 formed in accordance with various embodiments. In FIG. 6, a first outer conductor 620 and a second outer conductor 630 are counterwrapped (e.g., wrapped in opposed spiral directions) about a dielectric spacer 610. The dielectric spacer 610 may be made of a material having sufficient insulative properties to insulate the outer conductors from a central conductor disposed in an interior of the dielectric spacer, while also providing for flexibility to allow the common mode trap assembly 600 to bend and/or flex. In various embodiments, the first outer conductor 620 and the second outer conductor 630 may be oriented perpendicularly to each other at the point at which they cross, or orthogonally to each other. Accordingly, coupling between the first outer conductor 620 and the second outer conductor 630 is avoided.

It may be noted that the dielectric spacer 610 may have different cross-sectional shapes in various embodiments, such as, for example, square, or circular. In the case of a square dielectric spacer, the outer conductors may be oriented at 45 degrees with respect to top and bottom surfaces of the dielectric spacer to achieve orthogonal crossing of the outer conductors. The pitch and/or length of the outer conductors may be selected for a dielectric spacer having a circular cross section to provide orthogonal crossing. For example, the outer conductors may cooperate to form a series of contiguously joined common mode traps, with each common mode trap corresponding to a number of wraps of the first and second common mode trap conductors about the dielectric spacer (in the embodiment depicted by FIG. 6, N=1).

Figure 7:
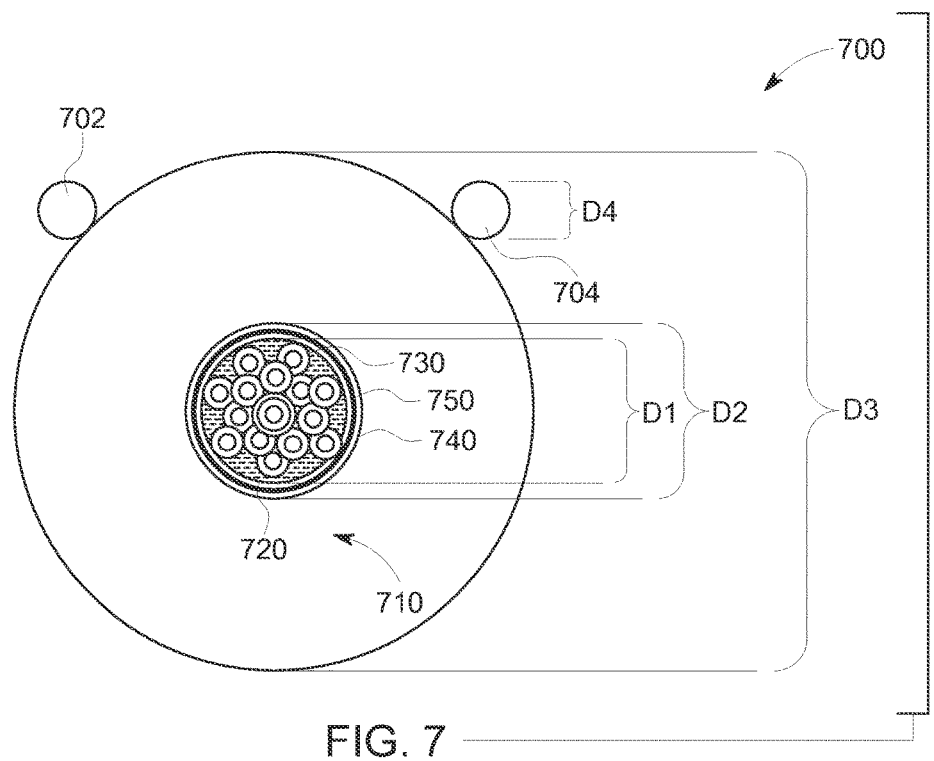
FIG. 7 provides a schematic cross-sectional view of a common mode trap assembly formed in accordance with various embodiments.
Figure 8:
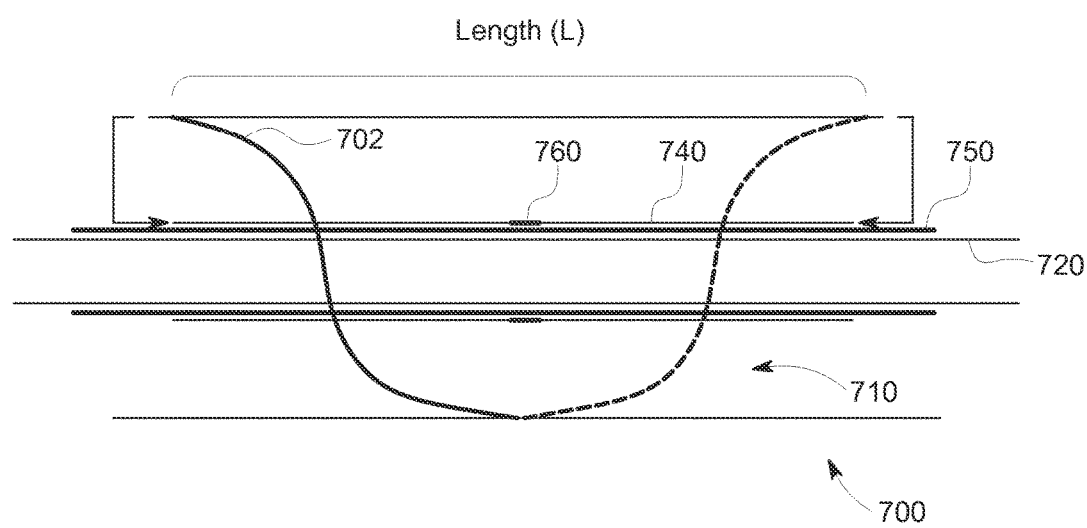
FIG. 8 provides a schematic side view of the common mode trap assembly of FIG. 7.

FIG. 7 provides a schematic cross-sectional view of a common mode trap assembly 700 formed in accordance with various embodiments, and FIG. 8 provides a schematic side view of the common mode trap assembly 700. FIG. 7 provides an example having a central sleeve carrying signal conductors, and shield conductors disposed on dielectric spacer. It may be noted that signal shields may form a central conductor in various embodiments. Further, signal conductor shields may also be used as return wires, although addition path loss may result.

As seen in FIG. 7, the common mode trap assembly 700 includes a central conductor 730 arranged as a coaxial cable bundle including return path 720. A central sleeve 750 is interposed between the return path 720 and a sleeve conductor 740 disposed on an exterior of the central sleeve 750. A first outer conductor 702 and a second outer conductor 704 are spirally counterwound about a dielectric spacer 710 (the second outer conductor 704 is not shown in FIG. 8 for clarity and ease of illustration). As seen in FIG. 8, a circuit path may be defined between at least one of the outer conductors and the sleeve conductor 640, and one or more capacitors 760 may be disposed along the sleeve conductor 740 and used to tune the resonance of a common mode trap. The properties of common mode traps formed along a length of the common mode trap assembly 700 vary with the geometry and may be configured or tuned based on desired characteristics for a given application. For example, as best seen in FIG. 7, a first diameter D1 is defined by the return path 720, and a second diameter D2 is defined by the sleeve conductor 740. A third diameter D3 is defined by the dielectric spacer 710 (which has a circular cross-section in the illustrated embodiment), and a fourth diameter D4 is defined by the outer conductors 702, 704. By varying one or more of the diameters, the properties of the common mode trap assembly 700 may be tuned or configured for various applications. For example, generally, the closer the outer conductors are to the central sleeve or central conductor (e.g., the smaller the value of D3), the better the common mode trap assembly 700 will be at rejecting fields; however, the central conductor inductance and efficiency drops as the outer conductors become closer to the central sleeve or central conductor and efficiency drops. Accordingly, the particular dimensions selected for a given application may be determined based on a balancing of factors for the given application.

Figure 9:
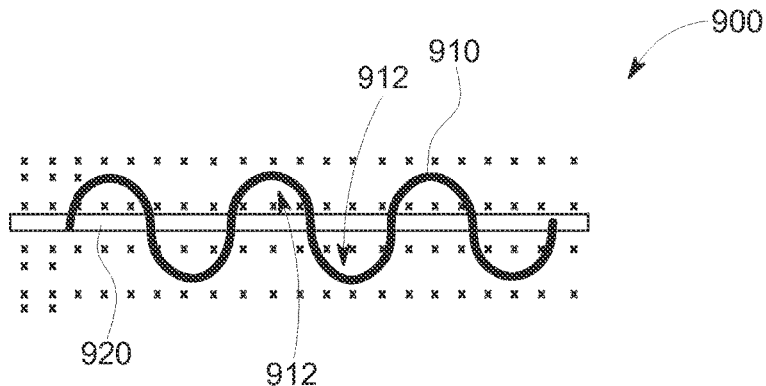
FIG. 9 provides a schematic side view of a common mode trap assembly formed in accordance with various embodiments.

FIG. 9 provides a side schematic view of a common mode trap assembly 900 formed in accordance with various embodiments. As seen in FIG. 9, the common mode trap assembly 900 includes a ribbon conductor 910 defining loops 912 on either side of a capacitive support 920. The capacitive support 920, for example, may be formed using one or more printed wire boards. Generally, the capacitive support 920 provides for distributed capacitance as well as to maintain the loops 912 at similar sizes and in opposed positions to each other. Accordingly, the loops 912 from a generally repeating 2-D butterfly structure, with currents induced by magnetic fields from the loops on one side of the capacitive support 920 acting to cancel current induced for the loops on the other side of the capacitive support 920. The embodiment depicted in FIG. 9 provides for relatively easy assembly. While the embodiment depicted in FIG. 9 provides continuous common mode trapping along its length, it may be noted that the embodiment is more rigid (less flexible) than the embodiment depicted in FIG. 3. Also, it may be noted that the embodiment depicted in FIG. 9 may provide for relatively modest blocking for the volume occupied by the common mode trap assembly 900. Flexibility may be improved, for example, by providing separate, discrete capacitive supports instead of the single capacitive support 920 shown in FIG. 9. Use of separate discrete capacitive supports with flexible lengths of the ribbon conductor 210 spanning therebetween provides an example of generally rigid butterfly structures that are joined by flexible sections.

Figure 10:
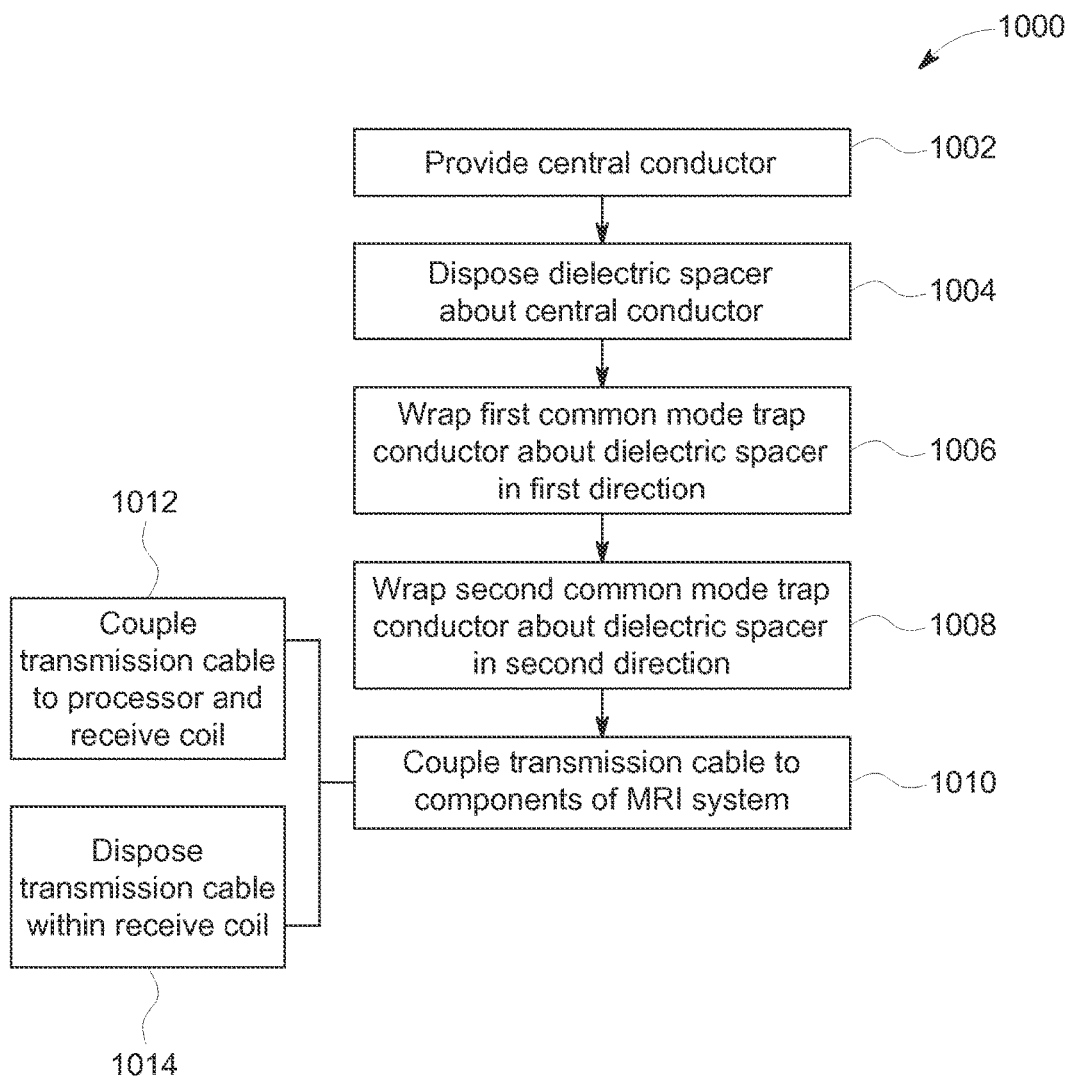
FIG. 10 is a flowchart of a method in accordance with various embodiments.
Figure 11:
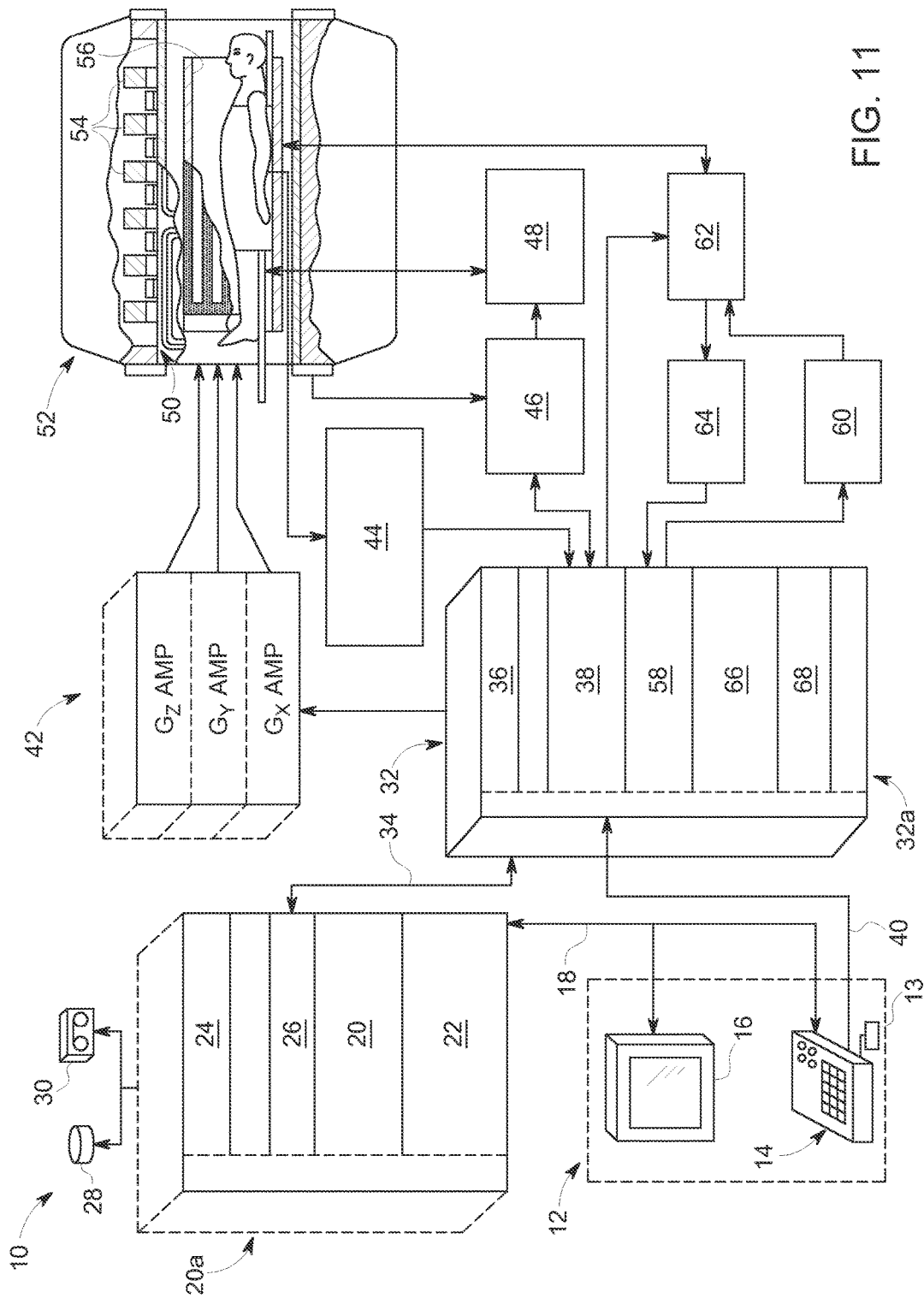
FIG. 11 illustrates a block schematic diagram of an MR system formed in accordance with various embodiments.

FIG. 10 provides a flowchart of a method 1000 for providing a transmission cable for a receive coil of an MRI system in accordance with various embodiments. The method 1000, for example, may employ or be performed by structures or aspects of various embodiments (e.g., systems and/or methods and/or process flows) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 1002, a central conductor is provided. The central conductor may be configured, for example, generally similarly to the central conductor 210 discussed herein.

At 1004, a dielectric spacer is disposed radially about the central conductor and extending along at least a portion of the length of the central conductor. For example, the dielectric spacer may have a through-hole pre-formed therethrough that is sized to accept the central conductor, and may be secured in place to an outer sleeve of the central conductor at one or more locations. The dielectric spacer may be configured, for example, generally similarly to the dielectric spacers 610, 710 discussed herein.

At 1006, a first common mode trap conductor (or first outer conductor) is wrapped in a spiral about the dielectric spacer in a first direction. The first common mode trap conductor, for example, may be a ribbon conductor, or, as another example, may be a wire.

At 1008, a second common mode trap conductor (or second outer conductor) is wrapped in a spiral about the dielectric spacer in a second direction that is opposite to the first direction. For example, the second common mode trap conductor may be wrapped in a spiral having a similar pitch to a spiral defined by the first common mode trap conductor, but in a different direction (e.g., clockwise vs. counterclockwise). It may be noted that first and second common mode trap conductors may be wrapped sufficiently loosely about the dielectric spacer so that the common mode trap conductors will not bind or couple to each other if the central conductor and dielectric spacer are bent or flexed.

At 1010, the transmission cable (or common mode trap assembly) formed by the central conductor, dielectric spacer, and first and second common mode trap conductors is coupled to components of an MRI system within a bore of the MRI system. For example, at 1012, the transmission cable is coupled to at least one processor of the MRI system and a receive coil. One end of the transmission cable may be coupled to the at least one processor and another end is coupled to the receive coil. Accordingly, the transmission cable may be used, for example, to transmit signals from the receive coil to the at least one processor for use in connection with image reconstruction. As another example, at 1014, the transmission cable is disposed within, or as a part of, the receive coil.

Various methods and/or systems (and/or aspects thereof) described herein may be implemented using a medical imaging system. For example, FIG. 14 depicts various major components of a MRI system 10 formed in accordance with various embodiments. The operation of the system is controlled from an operator console 12 which includes a keyboard or other input device 13, a control panel 14, and a display 16. The console 12 communicated through a link 18 with a separate computer system 20 that enables an operator to control the production and display of images on the screen 16. The computer system 20 includes a number of modules which communicate with each other through a backplane 20*a*. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light want, voice control, or any similar or equivalent input device, and may be used for interactive geometry prescription.

The system control 32 includes a set of modules connected together by a backplane 32*a*. These include a CPU module 36 and a pulse generator module 38 which connects to the operator console 12 through a serial link 40. It is through link 40 that the system control 32 receives commands from the operator to indicate the san sequence that is to be performed. The pulse generator module 38 operates the system components to carry out the desired scan sequence and produce data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensor connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 and RF shield (not shown) form a part of a magnet assembly 52 which includes a polarizing magnet 54 and a RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or apportion thereof and coupled through transmit/receive switch 62 to a preamplifier 64. The amplified MR signals are demodulated, filtered, and digitized in the receive section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid-state drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A continuous common mode trap assembly comprising:
   a central conductor having a length and configured to transmit a signal between a magnetic resonance imaging (MRI) receive coil and at least one processor of an MRI system;
   a dielectric spacer disposed radially about the central conductor and extending along at least a portion of the length of the central conductor;
   a first common mode trap conductor wrapped in a spiral about the dielectric spacer in a first direction; and
   a second common mode trap conductor counter-wrapped in a spiral about the dielectric spacer in a second direction opposite to the first direction;
   wherein the first common mode trap conductor and the second common mode trap conductor form a repeating butterfly configuration.

2. The continuous common mode trap assembly of claim 1, wherein the first common mode trap conductor and the second common mode trap conductor form plural contiguously joined common mode traps.

3. The continuous common mode trap assembly of claim 2, wherein each common mode trap is tuned independently of other common mode traps.

4. The continuous common mode trap assembly of claim 3, wherein each common mode trap is tuned to have a resonant frequency near an operating frequency of the MRI system.

5. The continuous common mode trap assembly of claim 3, wherein each common mode trap is tuned to a particular band to provide a broadband common mode trap assembly.

6. The continuous common mode trap assembly of claim 1, wherein the dielectric spacer has a circular cross section.

7. The continuous common mode trap assembly of claim 6, wherein the first common mode trap conductor and the second common mode trap conductor form plural contiguously joined common mode traps, wherein each common mode trap corresponds to a number of wraps of the first and second common mode trap conductors about the dielectric spacer.

8. The continuous common mode trap assembly of claim 1, wherein the first common mode trap conductor and the second common trap conductor cross each other orthogonally.

9. A method for providing a transmission cable for a receive coil of a magnetic resonance imaging (MRI) system, the method comprising:
providing a central conductor having a length and configured to transmit a signal between the receive coil and at least one processor of the MRI system;
disposing a dielectric spacer radially about the central conductor along at least a portion of the length of the central conductor;
wrapping a first common mode trap conductor spirally about the dielectric spacer in a first direction; and
wrapping a second common mode trap conductor spirally about the dielectric spacer in a second direction opposite to the first direction;
wherein the first common mode trap conductor and the second common mode trap conductor form a repeating butterfly configuration.

10. The method of claim 9, wherein wrapping the first common mode trap conductor and wrapping the second common mode trap conductor comprises arranging the first and second common mode trap conductors to cross each other orthogonally as the first and second common mode trap conductors wrap about the dielectric spacer.

11. The method of claim 9, wherein the dielectric spacer has a circular cross section.

12. The method of claim 11, wherein the first common mode trap conductor and the second common mode trap conductor form plural contiguously joined common mode traps, wherein each common mode trap corresponds to a number of wraps of the first and second common mode trap conductors about the dielectric spacer.

13. The method of claim 9, further comprising coupling one end of the transmission cable to at least one processor of the MRI system and one end to the receive coil.

14. The method of claim 9, further comprising disposing the transmission cable inside the receive coil.

* * * * *